(12) United States Patent
Yamagiwa et al.

(10) Patent No.: US 12,490,512 B2
(45) Date of Patent: Dec. 2, 2025

(54) HIGH VOLTAGE NITRIDE SEMICONDUCTOR DEVICE

(71) Applicant: Panasonic Intellectual Property Management Co., Ltd., Osaka (JP)

(72) Inventors: Hiroto Yamagiwa, Hyogo (JP); Manabu Yanagihara, Osaka (JP); Takahiro Sato, Toyama (JP); Masahiro Hikita, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 360 days.

(21) Appl. No.: 18/264,561

(22) PCT Filed: Dec. 24, 2021

(86) PCT No.: PCT/JP2021/048123
§ 371 (c)(1),
(2) Date: Aug. 7, 2023

(87) PCT Pub. No.: WO2022/172625
PCT Pub. Date: Aug. 18, 2022

(65) Prior Publication Data
US 2024/0304630 A1    Sep. 12, 2024

(30) Foreign Application Priority Data
Feb. 15, 2021    (JP) .................. 2021-021550

(51) Int. Cl.
*H10D 84/86*    (2025.01)
*H10D 30/01*    (2025.01)
(Continued)

(52) U.S. Cl.
CPC ............. *H10D 84/86* (2025.01); *H10D 30/47* (2025.01); *H10D 30/475* (2025.01);
(Continued)

(58) Field of Classification Search
CPC ....... H01L 21/02389; H01L 21/18–326; H01L 21/02392; H01L 21/02395;
(Continued)

(56) References Cited

U.S. PATENT DOCUMENTS 8,536,622 B2 * 9/2013 Takemae ................ H10D 84/01
257/773
8,680,579 B2 * 3/2014 Briere .................. H10D 62/824
257/E29.246
(Continued)

FOREIGN PATENT DOCUMENTS

JP    2009-111016 A    5/2009
JP    2012-064900 A    3/2012
(Continued)

OTHER PUBLICATIONS

International Search Report issued on Mar. 29, 2022 in International Patent Application No. PCT/JP2021/048123, with English translation.

*Primary Examiner* — Maliheh Malek
(74) *Attorney, Agent, or Firm* — Rimon P.C.

(57) ABSTRACT

A semiconductor device includes third active regions that connect two finger-end portions of field effect transistors (FETs) spaced apart from each other, and includes, above the third active regions, portions of a third nitride semiconductor layer that includes P-type impurities.

19 Claims, 12 Drawing Sheets

(51) Int. Cl.
*H10D 30/47* (2025.01)
*H10D 62/85* (2025.01)
*H10D 64/23* (2025.01)
*H10D 84/05* (2025.01)

(52) U.S. Cl.
CPC ....... *H10D 62/8503* (2025.01); *H10D 64/257* (2025.01); *H10D 30/015* (2025.01); *H10D 84/05* (2025.01)

(58) Field of Classification Search
CPC ....... H01L 21/02398; H01L 21/02538–02549; H10D 62/85–854; H10D 84/86; H10D 30/475; H10D 64/257; H10D 30/015; H10D 30/021; H10D 30/051; H10D 30/061; H10D 30/47; H10D 30/60; H10D 30/83; H10D 30/87; H10D 62/83; H10D 62/343; H10D 84/00; H10D 84/01; H10D 84/0126; H10D 84/038; H10D 84/05; H10D 84/82; H10D 84/83; C23C 14/0617; C23C 16/301–303; C01B 21/072–0728; B81B 2203/0136
See application file for complete search history.

(56) References Cited

U.S. PATENT DOCUMENTS

| | | | | |
|---|---|---|---|---|
| 8,742,460 B2* | 6/2014 | Mishra | ................ | H10D 62/115 |
| | | | | 257/E29.246 |
| 9,245,845 B2* | 1/2016 | Kaibara | ................ | H10D 62/127 |
| 9,536,966 B2* | 1/2017 | Ogino | ................ | H10D 30/475 |
| 9,779,988 B2* | 10/2017 | Hill | ................ | H10D 10/60 |
| 9,905,683 B2* | 2/2018 | Lin | ................ | H10D 64/518 |
| 10,128,365 B2* | 11/2018 | Fayed | ................ | H01L 23/4821 |
| 10,396,148 B2* | 8/2019 | Takahashi | ................ | H10D 30/473 |
| 10,580,890 B2* | 3/2020 | Wu | ................ | H10D 30/603 |
| 10,672,876 B2* | 6/2020 | Tanimoto | ................ | H10D 62/824 |
| 11,430,874 B2* | 8/2022 | Kabir | ................ | H10D 64/254 |
| 11,502,026 B2* | 11/2022 | Shilmkar | ................ | H01L 24/06 |
| 11,837,559 B2* | 12/2023 | Watts | ................ | H01L 23/04 |
| 12,278,272 B2* | 4/2025 | Brun | ................ | H10D 64/256 |
| 12,419,069 B2* | 9/2025 | Okita | ................ | H10D 64/256 |
| 2005/0184339 A1* | 8/2005 | Allen | ................ | H10D 62/126 |
| | | | | 257/341 |
| 2006/0081985 A1* | 4/2006 | Beach | ................ | H10D 64/257 |
| | | | | 257/E29.252 |
| 2008/0149940 A1* | 6/2008 | Shibata | ................ | H01L 23/4824 |
| | | | | 257/E29.252 |
| 2009/0108357 A1* | 4/2009 | Takagi | ................ | H10D 64/257 |
| | | | | 257/365 |
| 2012/0068227 A1* | 3/2012 | Hikita | ................ | H10D 64/411 |
| | | | | 257/E29.246 |
| 2012/0091986 A1* | 4/2012 | Takemae | ................ | G05F 3/08 |
| | | | | 257/E27.06 |
| 2013/0122669 A1* | 5/2013 | Koyama | ................ | H10D 30/015 |
| | | | | 438/694 |
| 2013/0176013 A1* | 7/2013 | Takemae | ................ | H10D 84/05 |
| | | | | 323/311 |
| 2015/0179741 A1* | 6/2015 | Umeda | ................ | H10D 30/475 |
| | | | | 257/389 |
| 2015/0187907 A1* | 7/2015 | Yamada | ................ | H10D 64/514 |
| | | | | 438/127 |
| 2015/0279781 A1* | 10/2015 | Kaibara | ................ | H10D 62/127 |
| | | | | 257/775 |
| 2017/0104063 A1* | 4/2017 | Zhang | ................ | H10D 62/151 |
| 2018/0308926 A1* | 10/2018 | Takahashi | ................ | H10D 62/357 |
| 2019/0109570 A1* | 4/2019 | Vedula | ................ | H10D 84/85 |
| 2019/0172946 A1* | 6/2019 | Wu | ................ | H10D 30/65 |
| 2020/0075479 A1* | 3/2020 | Khalil | ................ | H01L 23/5226 |
| 2020/0118922 A1* | 4/2020 | Hill | ................ | H03F 1/0288 |
| 2021/0202408 A1* | 7/2021 | Khalil | ................ | H10D 64/257 |
| 2022/0020874 A1* | 1/2022 | Fisher | ................ | H10D 62/127 |
| 2022/0254902 A1* | 8/2022 | Okita | ................ | H10D 30/475 |
| 2022/0376104 A1* | 11/2022 | Bisges | ................ | H10D 30/4755 |
| 2023/0178436 A1* | 6/2023 | Gardner | ................ | H10D 30/43 |
| 2023/0253490 A1* | 8/2023 | Fisher | ................ | H10D 62/127 |
| | | | | 257/272 |
| 2023/0268343 A1* | 8/2023 | Wong | ................ | H01L 23/49844 |
| | | | | 257/368 |
| 2025/0022796 A1* | 1/2025 | Mori | ................ | H01L 23/5228 |
| 2025/0185277 A1* | 6/2025 | Bothe | ................ | H10D 62/8503 |

FOREIGN PATENT DOCUMENTS

| | | |
|---|---|---|
| JP | 2012-069966 A | 4/2012 |
| JP | 5095387 B2 | 12/2012 |
| JP | 5797082 B2 | 10/2015 |
| JP | 2017-526169 A | 9/2017 |
| JP | 2018-186142 A | 11/2018 |
| JP | 6434609 B2 | 12/2018 |
| WO | 2014/041731 A1 | 3/2014 |
| WO | 2016/070463 A1 | 5/2016 |

\* cited by examiner

HIGH VOLTAGE NITRIDE SEMICONDUCTOR DEVICE

CROSS-REFERENCE OF RELATED APPLICATIONS

This application is the U.S. National Phase under 35 U.S.C. § 371 of International Patent Application No. PCT/JP2021/048123, filed on Dec. 24, 2021, which in turn claims the benefit of Japanese Patent Application No. 2021-021550, filed on Feb. 15, 2021, the entire disclosures of which Applications are incorporated by reference herein.

TECHNICAL FIELD

The present disclosure relates to a semiconductor device that includes a nitride semiconductor layer, and in particular to a semiconductor device for use in, for instance, a switching power supply circuit that operates at a high voltage and a high frequency.

BACKGROUND ART

A group III-V nitride-based compound semiconductor typified by a gallium nitride (GaN) semiconductor, that is, a so-called nitride semiconductor is a compound semiconductor made of aluminum (Al), gallium (Ga), and indium (In) that are group III elements and nitrogen (N) that is a group V element. The general formula of such a nitride semiconductor is represented by $In_xGa_yAl_{1-x-y}N$ ($0 \leq x \leq 1$, $0 \leq y \leq 1$, $x+y \leq 1$).

Various mixed crystals can be formed using a nitride semiconductor, and heterojunction interfaces can be readily formed. Heterojunction of nitride semiconductors has features that a high-concentration two-dimensional electron gas (2DEG) layer is generated at the junction interface due to spontaneous polarization and piezo polarization. A field effect transistor (FET) in which such a high-concentration 2DEG layer is used as a carrier has been attracting attention as a high-frequency and high-power device. An FET in which a nitride semiconductor is used is expected to be applied to a high-output power supply that operates at a high voltage and a high frequency, taking advantage of a great band gap and high electron mobility, for instance.

When an FET operates at a high frequency, a lot of heat may be generated. If the temperature of the FET excessively increases, performance of the FET decreases, and power supply performance decreases. Specifically, output is limited due to a decrease in saturation current of the FET, and a decrease in reliability due to a decrease in voltage tolerance of the FET, for instance.

In order to reduce such an increase in temperature of an FET, a semiconductor device has been proposed in which active regions having FETs are provided spaced apart from one another, and the FETs are connected in parallel (refer to Patent Literature (PTL) 1 and PTL 2). With such a semiconductor device structure, heat-generating regions of the FETs are distributed, and an increase in temperature of the FETs can be reduced.

CITATION LIST

Patent Literature

[PTL 1] Japanese Unexamined Patent Application Publication No. 2012-69966
[PTL 2] Japanese Unexamined Patent Application Publication (Translation of PCT Application) No. 2017-526169

SUMMARY OF INVENTION

Technical Problem

Part (a) of FIG. 12 is a plan view of conventional FET 9 in which a nitride semiconductor is used, and (b) of FIG. 12 illustrates a cross section taken along A-A in (a) of FIG. 12. In conventional FET 9, a plurality of active regions 910 each including an FET that includes source electrode 911, drain electrode 912, P-type nitride semiconductor layer 913, and gate electrode 914 are provided spaced apart from and in parallel to one another. Inactive region 990 is necessary to define active regions 910, separate from other elements, and reduce parasitic capacitance of regions in which electrode pads and lines, for instance, are provided. P-type nitride semiconductor layer 913 and gate electrodes 914 extend over each active region 910 and over a portion of inactive region 990.

Source electrodes 911 are connected to source collecting line 975 via source lines 915, drain electrodes 912 are connected to drain collecting line 976 via drain lines 916, and gate electrodes 914 are connected to gate collecting line 974, so that FETs 9 are connected in parallel.

However, FET 9 that includes a nitride semiconductor shown in (a) of FIG. 12 has a problem that a high drain leakage current flows at a gate voltage lower than or equal to a threshold voltage. In view of the application of an FET as a power supply, a drain leakage current needs to be sufficiently decreased.

A leakage path of such a drain leakage current is considered to be formed at an interface between active region 910 and inactive region 990. Part (c) of FIG. 12 illustrates a cross section taken along B-B in (a) of FIG. 12. In FET 9, a carrier concentration is controlled by the potential of P-type nitride semiconductor layer 913 above two-dimensional electron gas 905 to create on and off states, yet the potential at interface 980 between inactive region 990 and active region 910 is different from the potential in active region 910, and thus carriers are considered not to be completely removed. Part (d) of FIG. 12 illustrates a cross section taken along C-C in (a) of FIG. 12. Carriers remaining at interface 980 shown in (c) of FIG. 12 are led to source electrode 911 via two-dimensional electron gas 905 shown in (d) of FIG. 12, and are observed as a drain leakage current.

In view of this, an object of the present disclosure is to provide a semiconductor device that reduces a drain leakage current in an FET in which a nitride semiconductor is used.

Solution to Problem

In order to achieve the above object, a semiconductor device according to an aspect of the present disclosure includes: a substrate; a first nitride semiconductor layer provided above the substrate; a second nitride semiconductor layer provided above the first nitride semiconductor layer, and having a band gap greater than a band gap of the first nitride semiconductor layer; a first field effect transistor;

and a second field effect transistor. In a plan view of the substrate, the first nitride semiconductor layer and the second nitride semiconductor layer include: a first active region and a second active region in each of which a two-dimensional electron gas is generated; and an inactive region in which no two-dimensional electron gas is generated. The first field effect transistor is included in the first active region in the plan view of the substrate, and includes: a first source electrode and a first drain electrode that extend in a first direction in the plan view of the substrate; a portion of a first P-type nitride semiconductor layer provided between the first source electrode and the first drain electrode and extending in the first direction in the plan view of the substrate; and a first gate electrode provided above the portion of the first P-type nitride semiconductor layer. The second field effect transistor is included in the second active region in the plan view of the substrate, and includes: a second source electrode and a second drain electrode that extend in the first direction in the plan view of the substrate; a portion of a second P-type nitride semiconductor layer provided between the second source electrode and the second drain electrode and extending in the first direction in the plan view of the substrate; and a second gate electrode provided above the portion of the second P-type nitride semiconductor layer. The first nitride semiconductor layer and the second nitride semiconductor layer further include third active regions in each of which a two-dimensional electron gas is generated, the third active regions being connected to the first active region and the second active region in a second direction different from the first direction in the plan view of the substrate, at two end portions of each of the first active region and the second active region in the first direction. The third active regions each include a portion of a third nitride semiconductor layer extending in the second direction and including P-type impurities, and the portion of the first P-type nitride semiconductor layer and the portion of the second P-type nitride semiconductor layer are connected to each other via the portions of the third nitride semiconductor layer, in the first active region, the second active region, and the third active regions. Thus, in the semiconductor device, the active regions are connected at the two finger-end portions in the FETs spaced apart from each other, and the third nitride semiconductor layer that includes the P-type impurities is provided above the active regions.

Advantageous Effects of Invention

The semiconductor device according to the present disclosure yields advantageous effects of reducing a drain leakage current by reducing a two-dimensional electron gas under the third nitride semiconductor layer that includes P-type impurities.

DESCRIPTION OF EMBODIMENTS

In the following, embodiments of the present disclosure are to be described in detail with reference to the drawings. Note that the same signs are given to the same elements, and redundant description is omitted. Furthermore, "above/on" and "below/under" mean "upper level" and "lower level" in a cross section unless particularly stated, and include both of contact and non-contact states.

Embodiment 1

Figure 1:
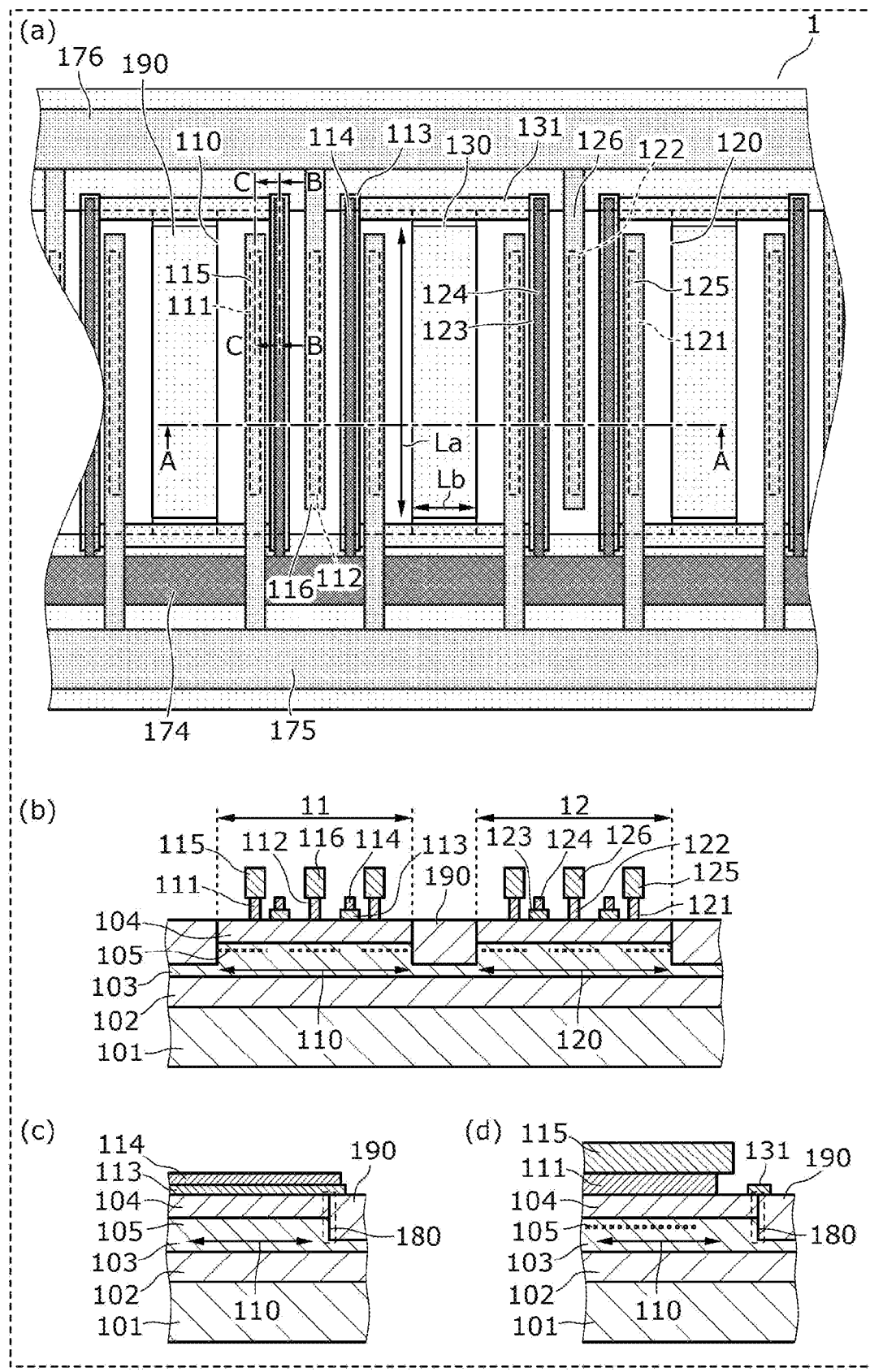
FIG. 1 illustrates an example of a semiconductor device according to Embodiment 1.

FIG. 1 illustrates an example of a semiconductor device according to Embodiment 1. Part (a) of FIG. 1 is a plan view of semiconductor device 1 according to Embodiment 1. First active region 110 and second active region 120 are provided in semiconductor device 1. First source electrode 111 and first drain electrode 112 that are finger-shaped (or in other words, extend in a first direction along a long side) are provided in first active region 110, and first P-type GaN layer 113 (an example of a first P-type nitride semiconductor layer) and first gate electrode 114 extend over first active region 110, across the interface between first active region 110 and inactive region 190, and over a portion of inactive region 190. Accordingly, first FET 11 is provided. Second source electrode 121 and second drain electrode 122 that are finger-shaped are provided in second active region 120, and second P-type GaN layer 123 (an example of a second P-type nitride semiconductor layer) and second gate electrode 124 extend over second active region 120, across the interface between second active region 120 and inactive region 190, and over a portion of inactive region 190. Accordingly, second FET 12 is provided. Here, first active region 110 and second active region 120 are regions in each of which a two-dimensional electron gas is generated, are aligned in a finger short-side direction (or stated differently, a second direction), and inactive region 190 in which no two-dimensional electron gas is generated is provided between first active region 110 and second active region 120.

First source electrode 111 and second source electrode 121 are connected to source collecting line 175 via first source line 115 and second source line 125, respectively. First drain electrode 112 and second drain electrode 122 are connected to drain collecting line 176 via first drain line 116 and second drain line 126, respectively. First gate electrode 114 and second gate electrode 124 are connected to gate collecting line 174. Accordingly, first FET 11 and second FET 12 are connected in parallel to each other.

Part (b) of FIG. 1 is a cross sectional view taken along A-A in (a) of FIG. 1. Above substrate 101 made of Si, buffer layer 102, GaN channel layer 103 (an example of a first nitride semiconductor layer), AlGaN barrier layer 104 (an example of a second nitride semiconductor layer) having a bang gap greater than a band gap of GaN channel layer 103 are provided in this order. Here, buffer layer 102 has a multi-layer structure made of AlN and AlGaN, for example, and has a total thickness of about 2.1 µm, for example. A composition of AlGaN barrier layer 104 is, for example, $Al_{0.17}Ga_{0.83}N$, and has a thickness of about 60 nm, for example. At the interface between GaN channel layer 103 and AlGaN barrier layer 104, highly concentrated 2DEG layer 105 is generated due to the effects of piezo polarization and spontaneous polarization. Inactive region 190 includes GaN channel layer 103 and AlGaN barrier layer 104 each having a resistance increased by ion injection of non-conductive impurities, for instance.

First source electrode 111, first drain electrode 112, and first P-type GaN layer 113 are provided above AlGaN barrier layer 104 in first active region 110, and first gate electrode 114 is provided above first P-type GaN layer 113. Accordingly, first FET 11 is provided. Second source electrode 121, second drain electrode 122, and second P-type GaN layer 123 are provided above AlGaN barrier layer 104 in second active region 120, and second gate electrode 124 is provided above second P-type GaN layer 123. Accordingly, second FET 12 is provided. First source electrode 111, first drain electrode 112, second source electrode 121, and second drain electrode 122 are each a stack of titanium (Ti) and aluminum (Al), for example, and are each in ohmic contact with 2DEG layer 105. First gate electrode 114 and second gate electrode 124 are each a stack of titanium (Ti) and aluminum (Al), for example, and are each in ohmic contact with first P-type GaN layer 113 and second P-type GaN layer 123, respectively.

In semiconductor device 1 according to Embodiment 1, as illustrated in (a) of FIG. 1, third active regions 130 in each of which a two-dimensional electron gas is generated are provided at two finger-end portions between first FET 11 and second FET 12 in the lengthwise direction, and connect first active region 110 and second active region 120. Third nitride semiconductor layer 131 that includes P-type impurities is provided over third active regions 130, and is connected to first P-type GaN layer 113 and second P-type GaN layer 123 in first active region 110, second active region 120, and third active regions 130. Third nitride semiconductor layer 131 that includes P-type impurities may have the same material as the material of first P-type GaN layer 113 and second P-type GaN layer 123.

Part (c) of FIG. 1 illustrates a cross section taken along B-B in (a) of FIG. 1. First P-type GaN layer 113 and first gate electrode 114 of first FET 11 are provided above AlGaN barrier layer 104. First P-type GaN layer 113 and first gate electrode 114 extend over first active region 110, across interface 180 between first active region 110 and inactive region 190, and over a portion of inactive region 190. Although not illustrated, second P-type GaN layer 123 and second gate electrode 124 of second FET 12 also extend over second active region 120 and over a portion of inactive region 190, similarly. Part (d) of FIG. 1 illustrates a cross section taken along C-C in (a) of FIG. 1. Third nitride semiconductor layer 131 is provided above AlGaN barrier layer 104 in first active region 110 connected to third active region 130. Third nitride semiconductor layer 131 extends over a portion of inactive region 190.

Here, a drain leakage current in semiconductor device 1 according to Embodiment 1 is to be considered. The FETs are in the off state when source-gate voltage Vgs is lower than or equal to threshold voltage Vth, and 2DEG layer 105 is not generated under first P-type 113 or second P-type GaN layer 123, as illustrated in (b) of FIG. 1. As illustrated in (c) and (d) of FIG. 1, at interface 180 between first active region 110 and inactive region 190, specific carriers do not remain, yet a leakage path through a crystal defect caused by ion injection, for instance, is generated. A leakage current flows through this leakage path in the off state in which a high electric field is generated. On the other hand, as illustrated in (d) of FIG. 1, 2DEG layer 105 disappears due to a depletion layer generated from P-type third nitride semiconductor layer 131 in the off state, in first active region 110 under third nitride semiconductor layer 131 that includes P-type impurities. Accordingly, in the off state, a leakage path generated at interface 180 is not connected, as a current path, to 2DEG layer 105 under first drain electrode 112 and first source electrode 111. As a result, a drain leakage current can be significantly reduced as compared with a conventional example.

Figure 2:
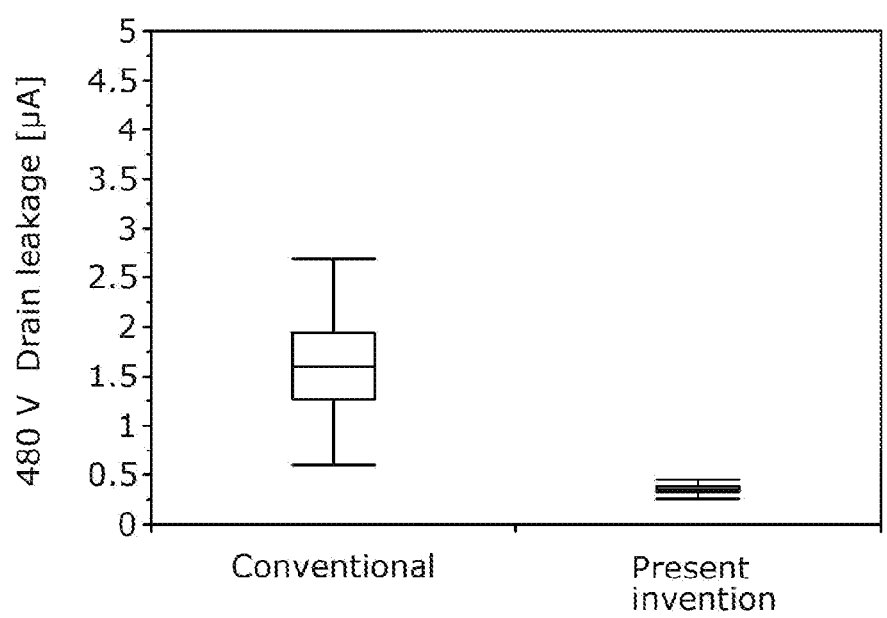
FIG. 2 is a box plot of drain leakage currents of a conventional semiconductor device and a semiconductor device according to the present disclosure.

FIG. 2 is a box plot of drain leakage currents of the semiconductor devices according to a conventional example and the present embodiment. In the semiconductor device according to the present embodiment, a decrease in drain leakage current by about a single decade is seen, as compared with the semiconductor device according to the conventional example.

Figure 3:
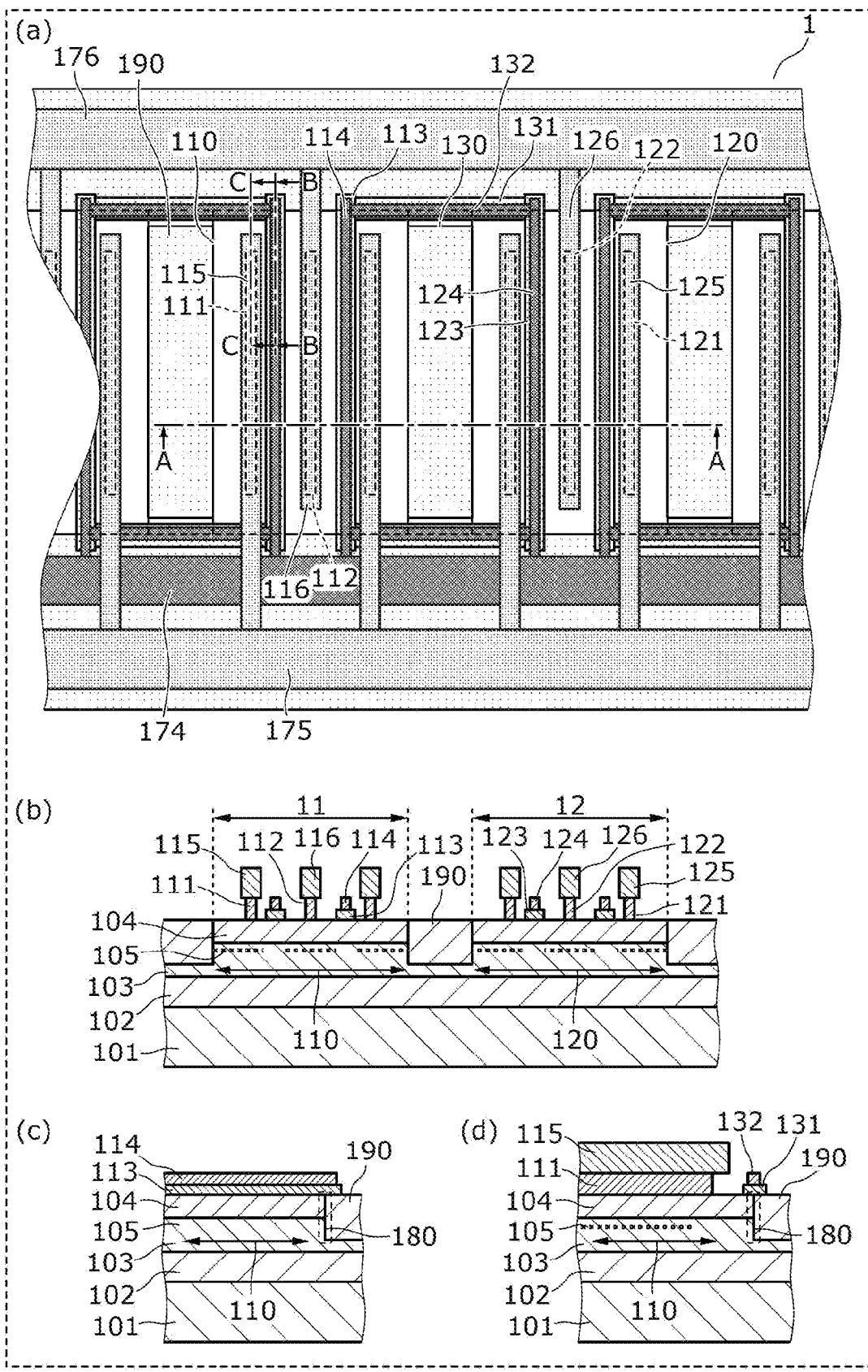
FIG. 3 illustrates another example of the semiconductor device according to Embodiment 1.

FIG. 3 illustrates another example of the semiconductor device according to Embodiment 1. As illustrated in the plan view in (a) of FIG. 3, Embodiment 1 may adopt a configuration in which third gate electrode 132 is provided above third nitride semiconductor layer 131, and is connected to first gate electrode 114 and second gate electrode 124. Part (b) of FIG. 3 is a cross sectional view taken along A-A in (a) of FIG. 3. Part (c) of FIG. 3 illustrates a cross section taken along B-B in (a) of FIG. 3. Part (d) of FIG. 3 illustrates a cross section taken along C-C in (a) of FIG. 3. By adopting such a configuration, a potential of third nitride semiconductor layer 131 is stabilized by third gate electrode 132, and 2DEG layer 105 is certainly prevented from being generated in first active region 110 under third nitride semiconductor layer 131. Accordingly, occurrence of a high-voltage leakage can be certainly prevented.

In Embodiment 1, as illustrated in (a) of FIG. 1, inactive region 190 may be provided, as a first inactive region, between first active region 110 in which first FET 11 is provided and second active region 120 in which second FET 12 is provided. Inactive region 190 as a first inactive region is surrounded by first active region 110, second active region 120, and third active regions 130, in the plan view of substrate 101. In this manner, heat-generating regions of the FETs can be separated, and an increase in temperature of the semiconductor device can be reduced.

Figure 4:
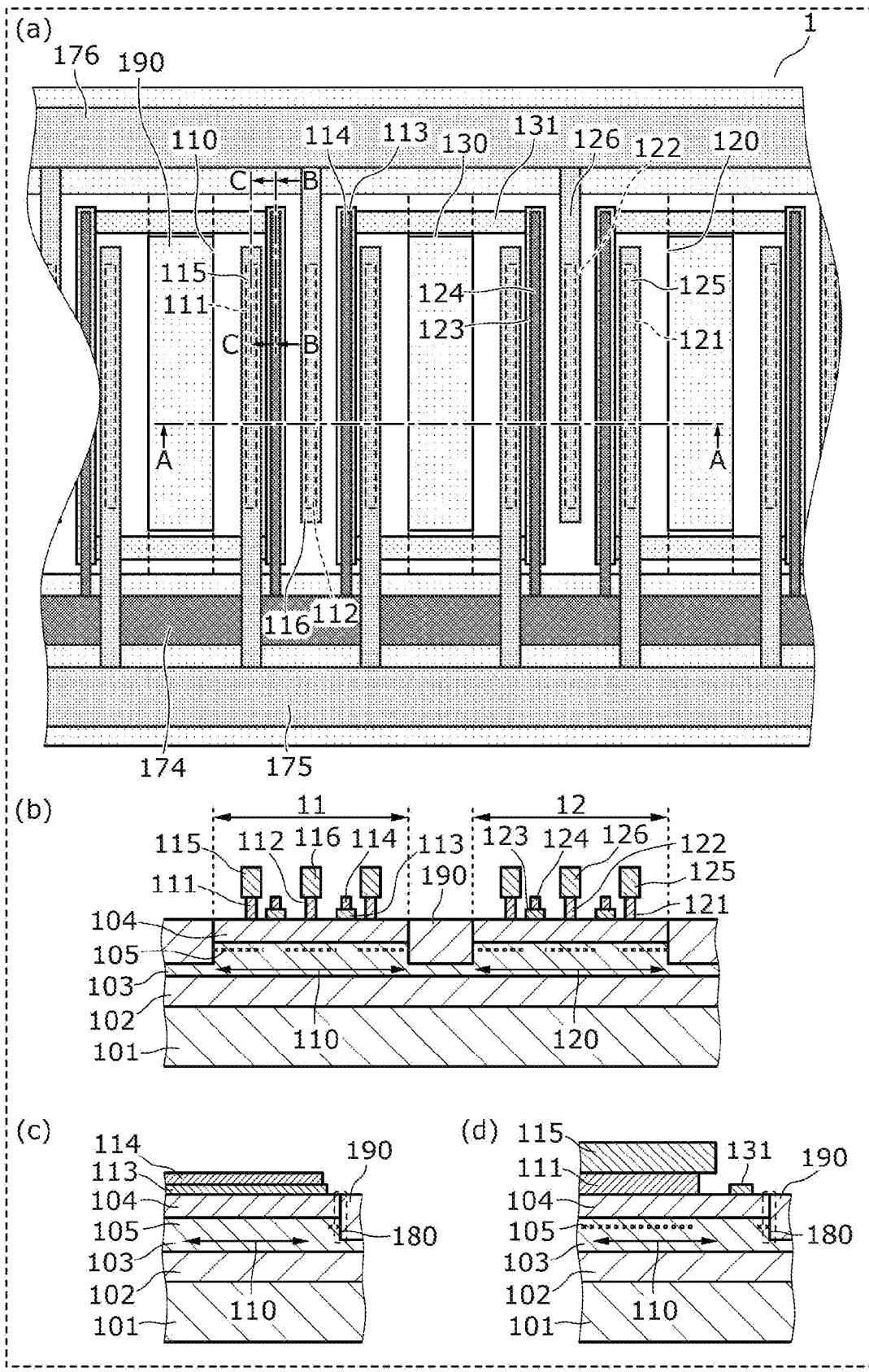
FIG. 4 illustrates another example of the semiconductor device according to Embodiment 1.

FIG. 4 illustrates another example of the semiconductor device according to Embodiment 1. As illustrated in the plan view in (a) of FIG. 4, Embodiment 1 may adopt a configuration in which finger-shaped first P-type GaN layer 113 has an end in first active region 110, and second P-type GaN layer 123 has an end in second active region 120. Furthermore, Embodiment 1 may adopt a configuration in which third nitride semiconductor layer 131 is connected to first P-type GaN layer 113 and second P-type GaN layer 123 in first active region 110, second active region 120, and third active region 130. Part (b) of FIG. 4 is a cross sectional view taken along A-A in (a) of FIG. 4. Part (c) of FIG. 4 illustrates a cross section taken along B-B in (a) of FIG. 4. Part (d) of FIG. 4 illustrates a cross section taken along C-C in (a) of FIG. 4. As illustrated in (d) of FIG. 4, 2DEG layer 105 can be prevented from being generated in first active region 110 under third nitride semiconductor layer 131. In this manner, a leakage path that connects first drain electrode 112 to first source electrode 111 via 2DEG layer 105 can be prevented from being formed, and thus a drain leakage current can be reduced as compared with the conventional example.

In Embodiment 1, as illustrated in (a) of FIG. 1, length La of first P-type GaN layer 113 in the finger lengthwise direction (that is, a length in a direction in which first P-type GaN layer 113 extends) may be longer than length Lb of third nitride semiconductor layer 131 (that is, the length in the second direction). In this manner, parasitic capacitance generated between third nitride semiconductor layer 131 and first source electrode 111 and between third nitride semiconductor layer 131 and second source electrode 121 can be reduced, and an increase in gate driving power can be reduced.

In Embodiment 1, the FETs may be normally off. The "normally off" state indicates Vth>0 [V], and 2DEG layer 105 is not generated under first P-type GaN layer 113, second P-type GaN layer 123, or third nitride semiconductor layer 131 when Vgs=0 [V]. When an FET is normally off, a pull-down register, for instance, may cause a short circuit between the gate and the source outside of the FET to turn off the FET, so that the FET can be readily protected.

Figure 5:
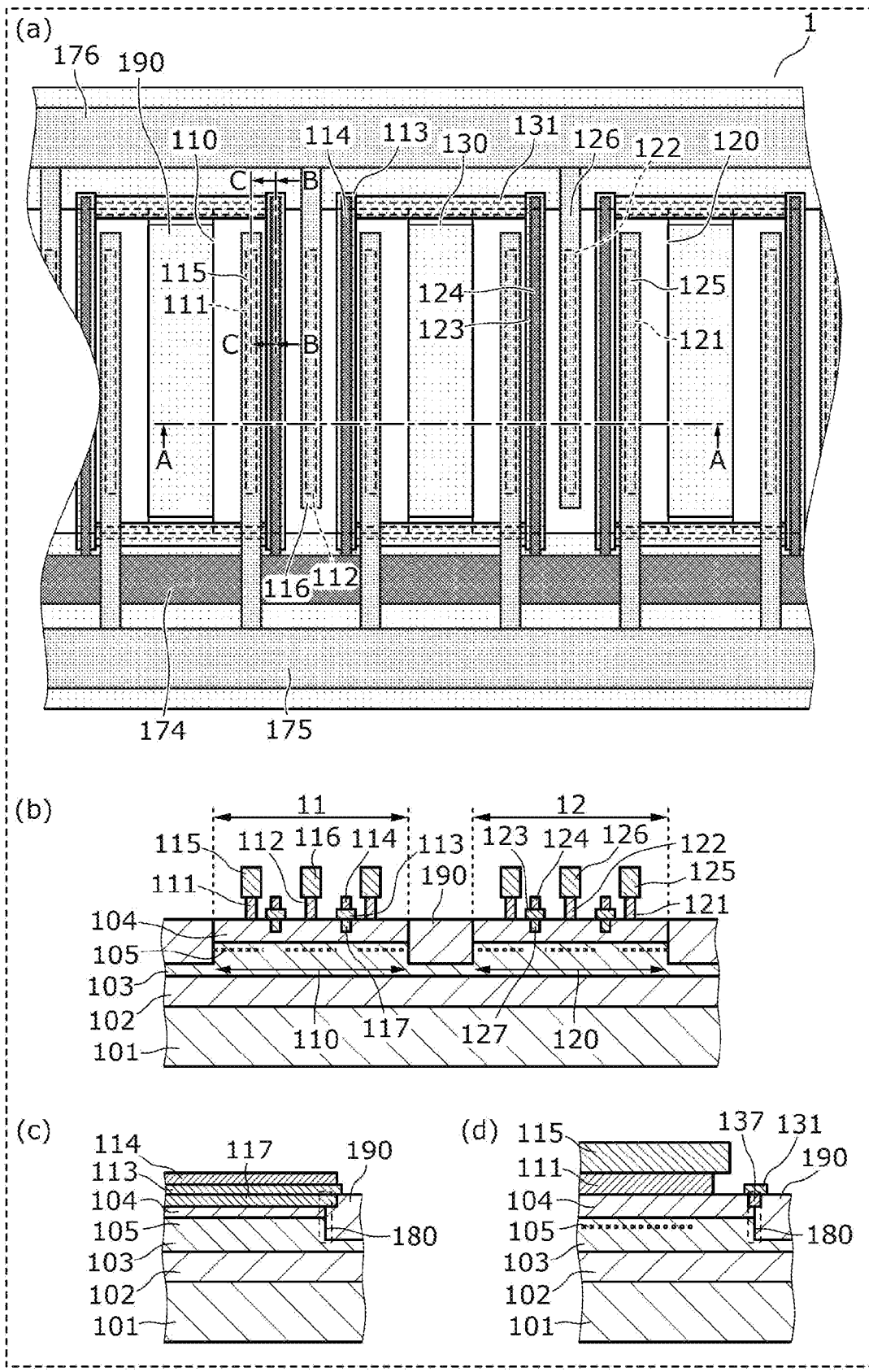
FIG. 5 illustrates another example of the semiconductor device according to Embodiment 1.

FIG. 5 illustrates another example of the semiconductor device according to Embodiment 1. In Embodiment 1, as illustrated in (a) of FIG. 5 and (b) of FIG. 5 showing a cross section taken along A-A in (a) of FIG. 5, recess structures 117, 127, and 137 may be provided in AlGaN barrier layer 104 under first P-type GaN layer 113, second P-type GaN layer 123, and third nitride semiconductor layer 131. In this manner, the FETs are placed in the normally off state. Recess structures 117 and 137 may be continuously provided and connected to each other, and recess structures 127 and 137 may be continuously provided and connected to each other. Parts (c) and (d) of FIG. 5 illustrate cross sections taken along B-B and C-C in (a) of FIG. 5, respectively. As illustrated in (c) of FIG. 5, recess structure 117 may extend through the active region into a portion of the inactive region, and as illustrated in (d) of FIG. 5, recess structure 137 may extend through the active region into a portion of the inactive region. Such structures can certainly prevent a leakage path from being formed between the active region and the inactive region via interface 180.

Figure 6:
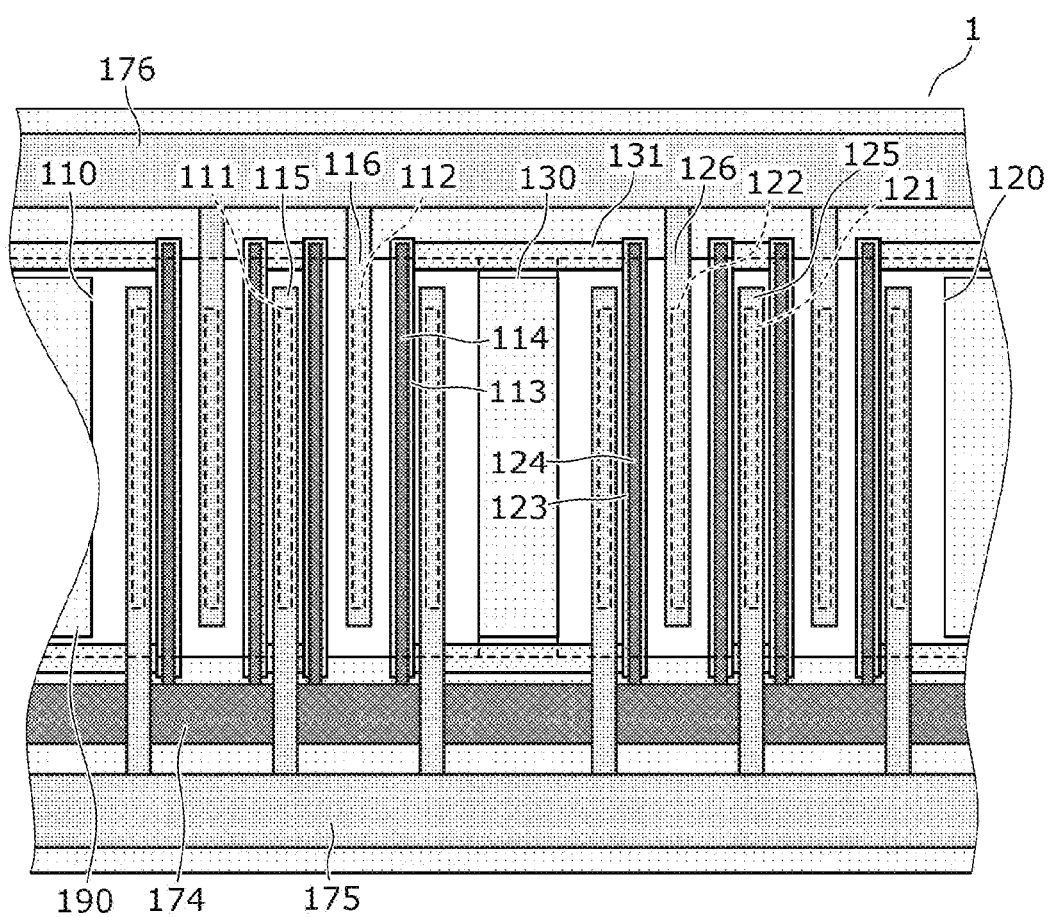
FIG. 6 illustrates another example of the semiconductor device according to Embodiment 1.

FIG. 6 illustrates another example of the semiconductor device according to Embodiment 1. In this example, as illustrated in FIG. 6, a configuration may be adopted in which a plurality of source electrodes, a plurality of drain electrodes, and a plurality of gate electrodes are provided in finger shape in each active region, in such a manner that when n is an integer of 2 or more, in first active region 110, n+1 (for example, 3) first source electrodes 111, n (for example, 2) first drain electrodes 112, 2×n (for example, 4) portions of first P-type GaN layer 113, and 2×n (for example, 4) first gate electrodes 114 are provided, whereas in second active region 120, n+1 (for example, 3) second source electrodes 121, n (for example, 2) second drain electrodes 122, 2×n (for example, 4) portions of second P-type GaN layer 123, and 2×n (for example, 4) second gate electrodes 124 are provided. Such a configuration simultaneously allows enhancement of drain current capability of FETs and distribution of heat-generating regions.

Here, out of n+1 first source electrodes 111 included in FET 11, n−1 (for example, 1) first source electrode(s) 111 between first drain electrodes 112 may be surrounded by first P-type GaN layer 113 in first active region 110. Similarly, to second FET 12, out of n+1 second source electrodes 121, n−1 (for example, 1) second source electrode(s) 121 between second drain electrodes 122 may be surrounded by second P-type GaN layer 123 in second active region 120. In this manner, a leakage path of a drain leakage current that leads to a source electrode between drain electrodes can be prevented from being formed, so that a drain leakage current can be reduced.

Figure 7:
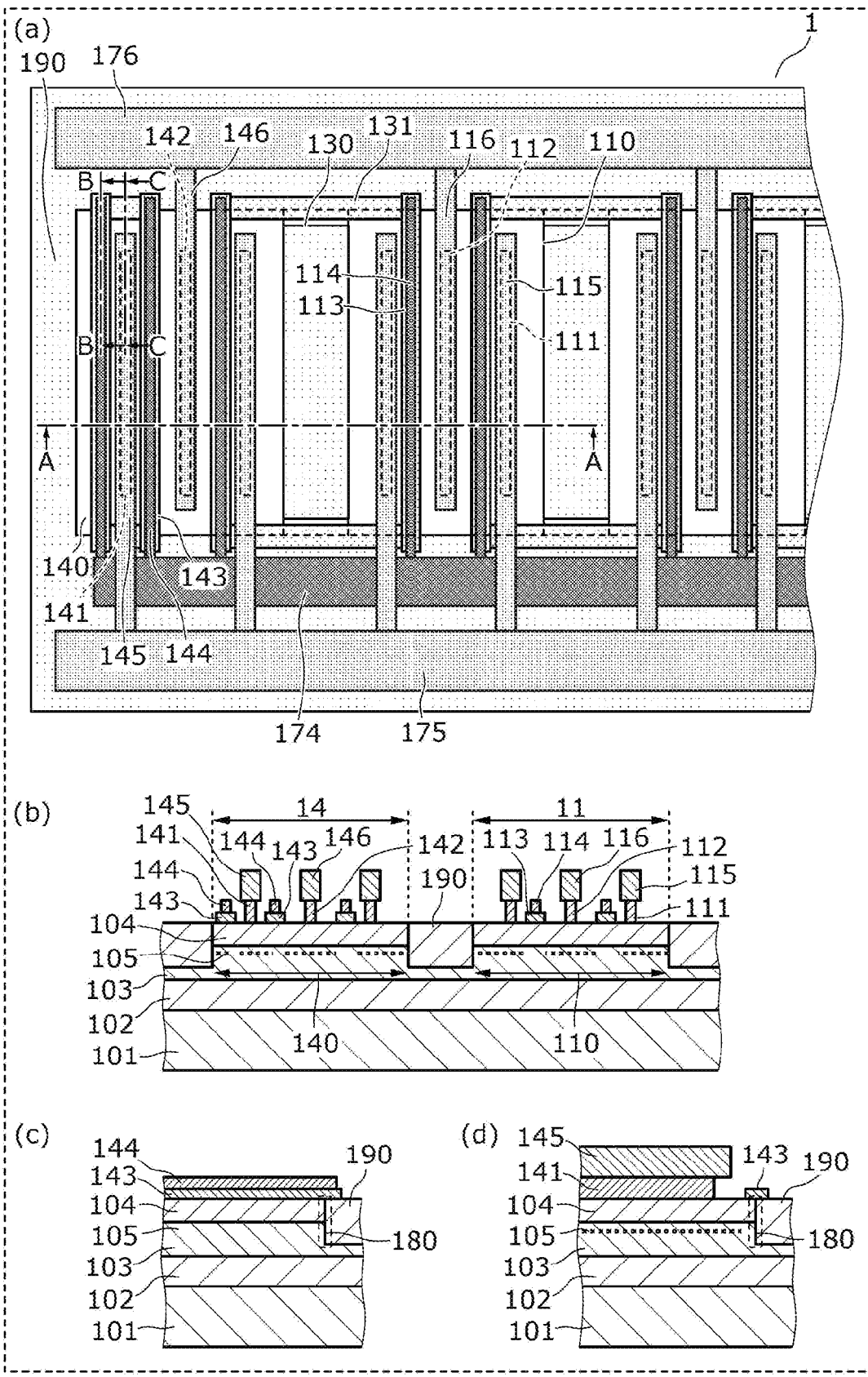
FIG. 7 illustrates another example of the semiconductor device according to Embodiment 1.

FIG. 7 illustrates another example of the semiconductor device according to Embodiment 1. In Embodiment 1, out of aligned active regions, fourth active regions 140 in each of which a two-dimensional gas is generated are provided at two ends of semiconductor device 1, and third FET 14 provided in each of fourth active regions 140 is to be described. As illustrated in (a) of FIG. 7, third source electrode 141 and third drain electrode 142 that are finger-shaped are provided in each of fourth active regions 140, and third P-type GaN layer 143 (an example of a third P-type nitride semiconductor layer) and third gate electrode 144 extend over fourth active region 140, across the interface between fourth active region 140 and inactive region 190, and over a portion of inactive region 190. Accordingly, third FET 14 is provided. Third source line 145 and third drain line 146 correspond to first source line 115 and first drain line 116 in Embodiment 1, respectively. Part (b) of FIG. 7 illustrates a cross section taken along A-A in (a) of FIG. 7. Within third FET 14 provided in each fourth active region 140, third P-type GaN layer 143 located at an end portion in a direction in which the active regions are aligned may surround third source electrode 141 adjacent (that is, located at an end portion in the second direction) to third P-type GaN layer 143. Part (c) of FIG. 7 illustrates a cross section taken along B-B in (a) of FIG. 7, and (d) of FIG. 7 illustrates a cross section taken along C-C in (a) of FIG. 7. As illustrated in (c) and (d) of FIG. 7, carriers remain at interface 180 between first active region 110 and inactive region 190, yet as illustrated in (d) of FIG. 7, 2DEG layer 105 is not generated in first active region 110 under third P-type GaN layer 143. In this manner, a leakage path that leads from third drain electrode 142 to third source electrode 141 via 2DEG layer 105 can be prevented from being formed, and thus a drain leakage current in third FET 14 provided at each of two ends of semiconductor device 1 can be reduced.

As illustrated in (a) and (b) of FIG. 7, third source electrode 141 and first source electrode 111 may have the same electrode width. Such a configuration allows source electrodes of FETs 14 at the two ends and other FETs to have the same resistance and allows drain currents flowing through the FETs to have the same value, so that concentrated heat generation in the FETs can be avoided.

Variation 1 of Embodiment 1

Figure 8:
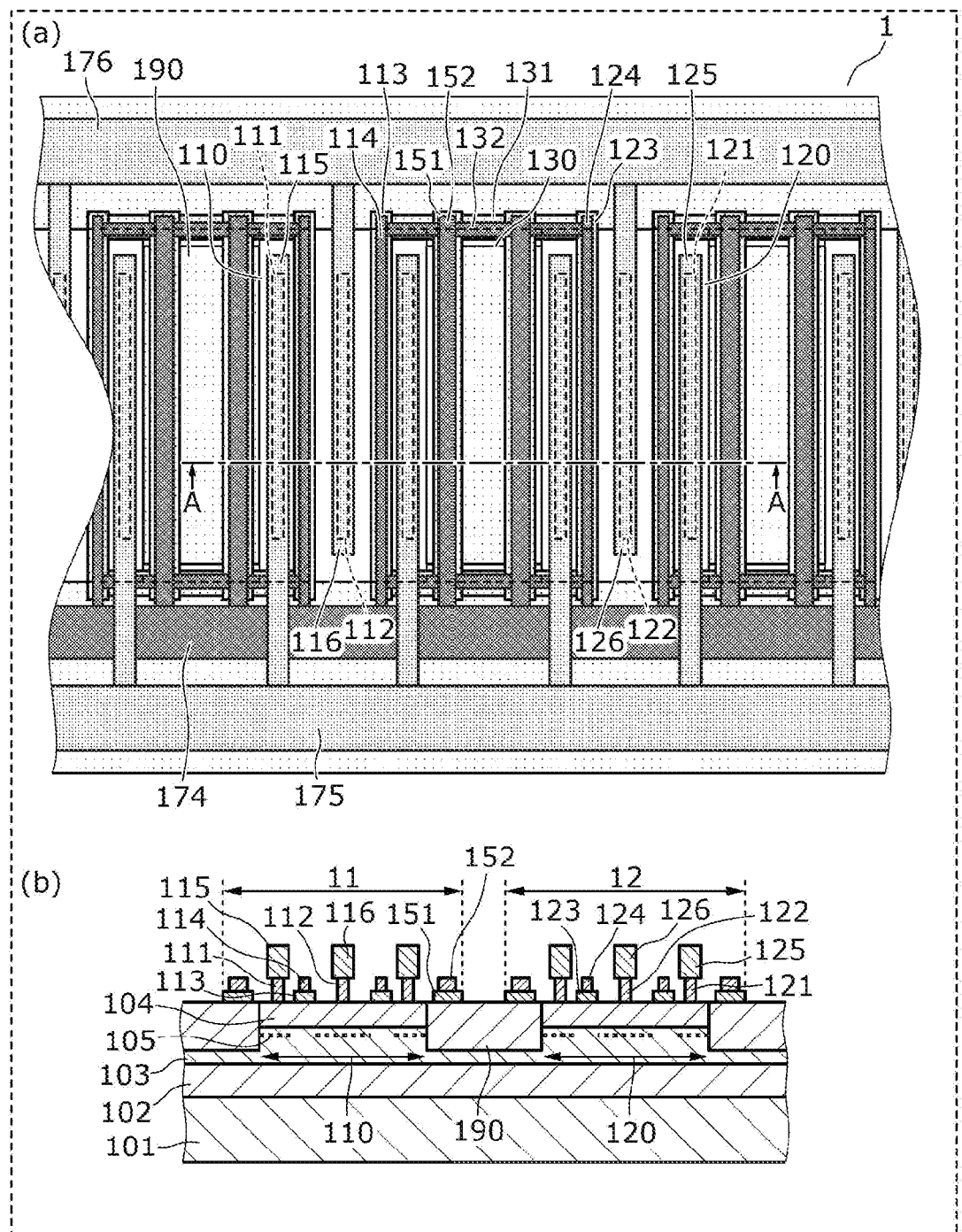
FIG. 8 illustrates an example of a semiconductor device according to Variation 1 of Embodiment 1.

Variation 1 of Embodiment 1 is to be described. FIG. 8 illustrates an example of a semiconductor device according to Variation 1 of Embodiment 1. Part (a) of FIG. 8 is a plan view of semiconductor device 1 according to Variation 1 of Embodiment 1. Gate line 152 is provided between first FET 11 provided in first active region 110 and second FET 12 provided in second active region 120, and is connected to third gate electrodes 132 at two finger-end portions. Gate line 152 may be connected to gate collecting line 174.

In semiconductor device 1 according to Variation 1 of Embodiment 1, a gate voltage can be applied from the two finger ends of first gate electrode 114 and the second gate electrode via gate line 152 and third gate electrodes 132, and thus the speed of switching of the FETs can be increased.

In Variation 1 of Embodiment 1, as illustrated in (b) of FIG. 8 that is a cross sectional view taken along A-A in (a) of FIG. 8, gate line 152 may be provided above inactive region 190 as a second inactive region. Inactive region 190 as a second inactive region is provided between first active region 110 and second active region 120 in the plan view of substrate 101, and is surrounded by first active region 110, second active region 120, and third active regions 130 in the plan view of substrate 101. In this manner, gate parasitic capacitance due to gate line 152 can be reduced, and an increase in gate drive power can be reduced.

In Variation 1 of Embodiment 1, the material of gate line 152 is the same as the material of first gate electrode 114. Accordingly, gate line 152 and first gate electrode 114 can be provided in the same process, and thus gate line 152 can be readily provided.

In Variation 1 of Embodiment 1, as illustrated in (a) of FIG. 8, the length of gate line 152 in the short-side direction may be longer than the length of first gate electrode 114 in the short-side direction. Accordingly, the resistance of gate line 152 per unit length can be decreased, and the speed of switching of the FET can be increased.

In Variation 1 of Embodiment 1, as illustrated in (a) of FIG. 8, third nitride semiconductor layer 151 that includes P-type impurities is provided under gate line 152. In this manner, a difference in height between gate line 152 and third gate electrode 132 can be reduced, and thus gate line 152 can be prevented from being broken.

Variation 2 of Embodiment 1

Figure 9:
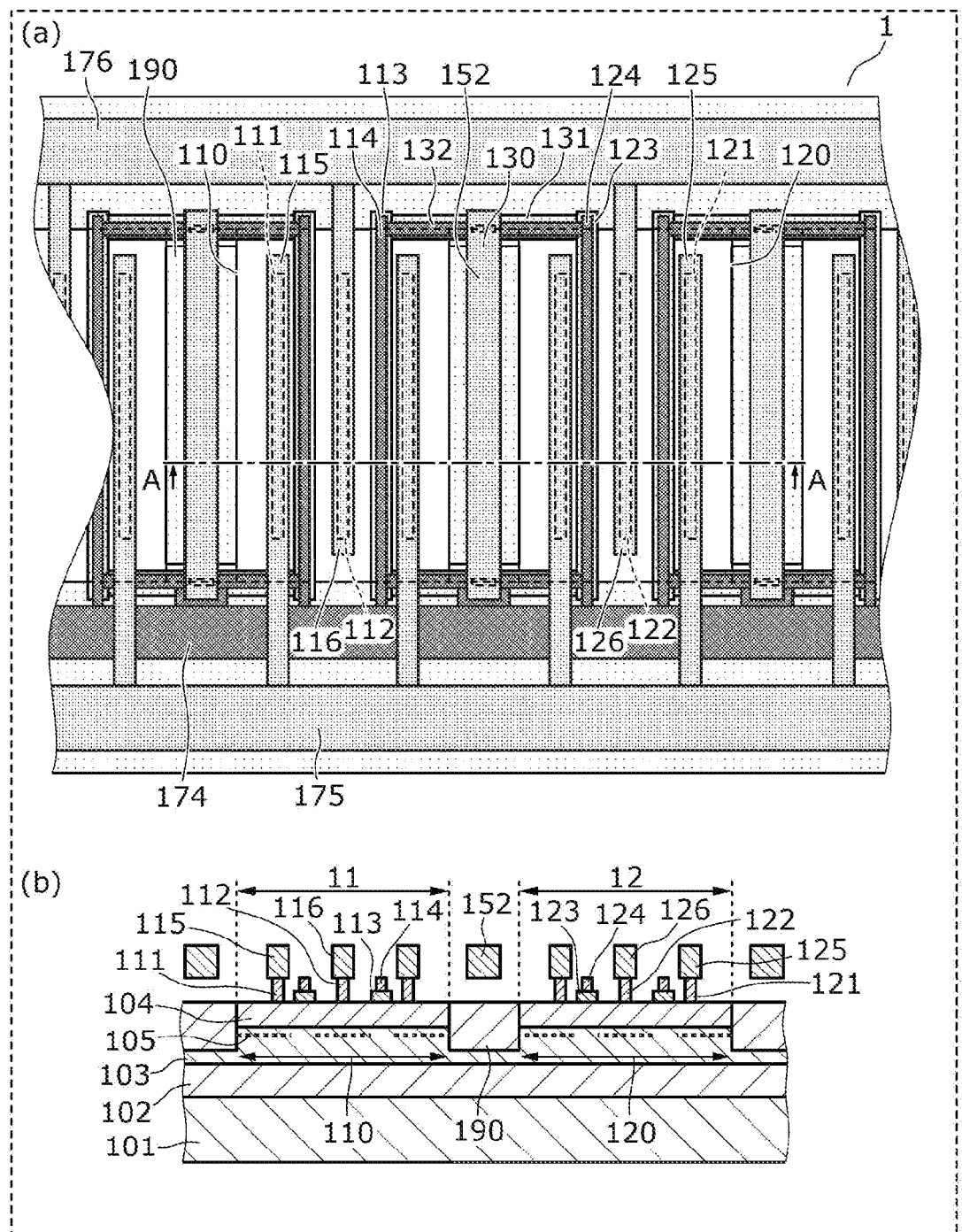
FIG. 9 illustrates an example of a semiconductor device according to Variation 2 of Embodiment 1.

FIG. 9 illustrates an example of a semiconductor device according to Variation 2 of Embodiment 1. In Variation 2 of Embodiment 1, as illustrated in (a) of FIG. 9, gate line 152 is provided using the same material as that of first source line 115. Part (b) of FIG. 9 is a cross sectional view taken along A-A in (a) of FIG. 9. Typically, first source line 115 has a smaller resistance per unit length than that of first gate electrode 114, and thus the resistance of gate line 152 can be decreased by providing gate line 152 using the same material as that of first source line 115, and thus the speed of switching of the FET can be increased.

Embodiment 2

Figure 10:
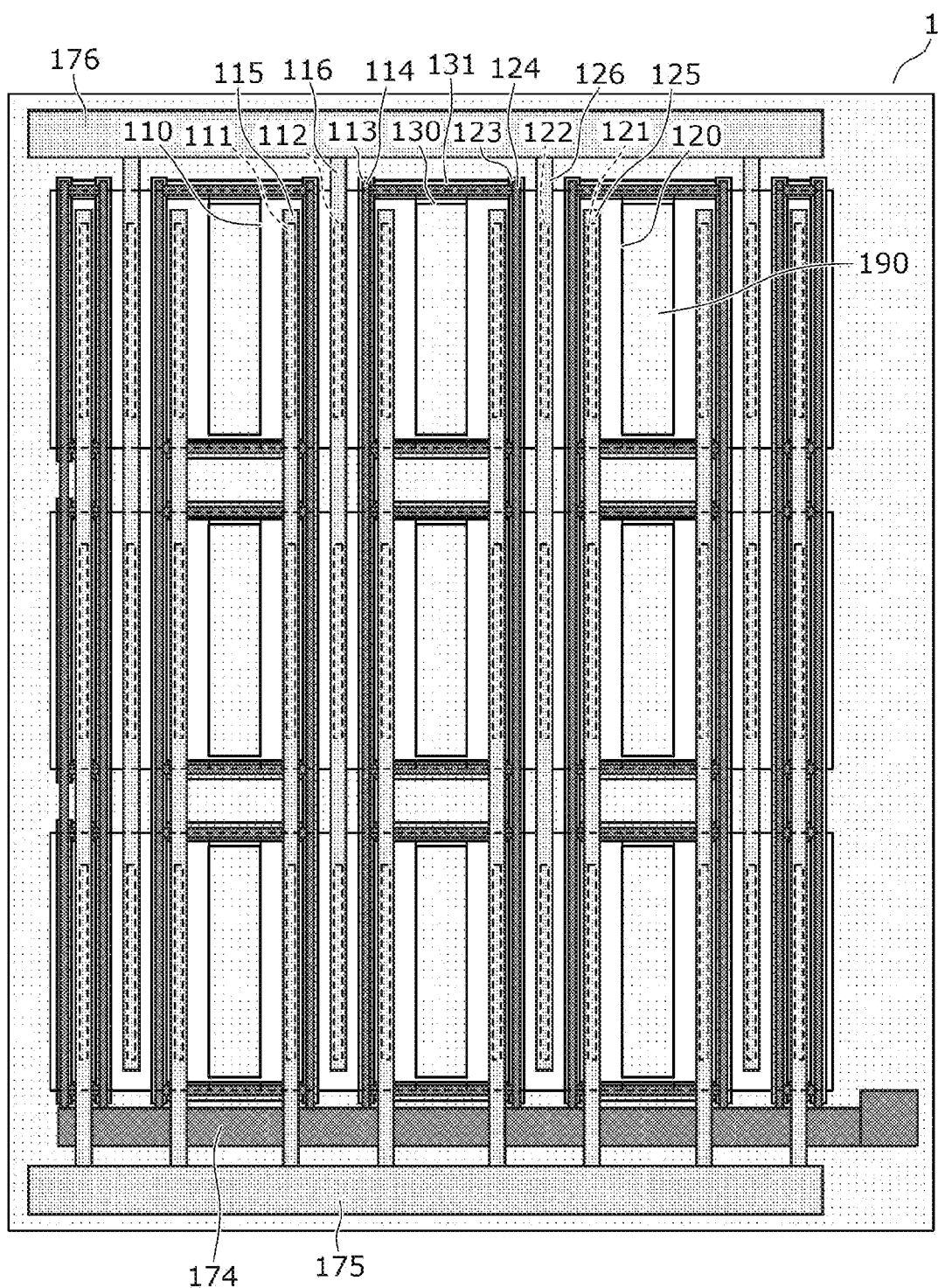
FIG. 10 illustrates an example of a semiconductor device according to Embodiment 2.

Semiconductor device 1 according to Embodiment 2 is to be described. FIG. 10 is a plan view of semiconductor device 1 according to Embodiment 2. Plural first active regions 110 and plural second active regions 120 are provided in the finger lengthwise direction and spaced apart from one another. Inactive region 190 is provided as a third inactive region between first active regions 110 provided, and inactive region 190 is provided as a fourth inactive region between second active regions 120 provided. First FET 11 is provided in each of first active regions 110, and second FET 12 is provided in each of second active regions 120. Plural third active regions 130 and plural portions of third nitride semiconductor layer 131 that includes P-type impurities are provided, being spaced apart from one another in the finger lengthwise direction. Third nitride semiconductor layer 131 is connected to first P-type GaN layer 113 and second P-type GaN layer 123 in first active region 110, second active region 120, and third active regions 130.

In semiconductor device 1 according to Embodiment 2, first source electrodes 111 are connected to one another via single first source line 115, first drain electrodes 112 are connected to one another via single first drain line 116, portions of first P-type GaN layer 113 are elongated in the lengthwise direction and connected to one another, and first gate electrodes 114 are elongated in the finger lengthwise direction and connected to one another. Further, second source electrodes 121 are connected to one another via single second source line 125, second drain electrodes 122 are connected to one another via single second drain line 126, portions of second P-type GaN layer 123 are continuously provided in the finger lengthwise direction, and first gate electrodes 114 are continuously provided in the finger lengthwise direction.

Since first FET 11 and second FET 12 are separately provided in the finger lengthwise direction, heat-generating regions of the FETs can be distributed, so that an increase in temperature of semiconductor device 1 can be reduced. Furthermore, third active regions 130 and third nitride semiconductor layer 131 are provided between first FET 11 and second FET 12 provided separately in the finger lengthwise direction, so that an increase in a drain leakage current in each of the FETs separately provided in the finger lengthwise direction can be reduced.

In semiconductor device 1 according to Embodiment 2, first source electrodes are connected by single first source line 115 and first drain electrodes are connected by single first drain line 116, so that parasitic resistance and parasitic capacitance of the source line and the drain line can be reduced, and thus heat generated by the FETs can be reduced.

In semiconductor device 1 according to Embodiment 2, as illustrated in FIG. 10, first P-type GaN layer 113 extends in the finger lengthwise direction and is connected and first gate electrode 114 is provided above first P-type GaN layer 113, and thus a difference in height made by first gate electrode 114 is eliminated, so that reliability of first gate electrode 114 improves.

Embodiment 3

Figure 11:
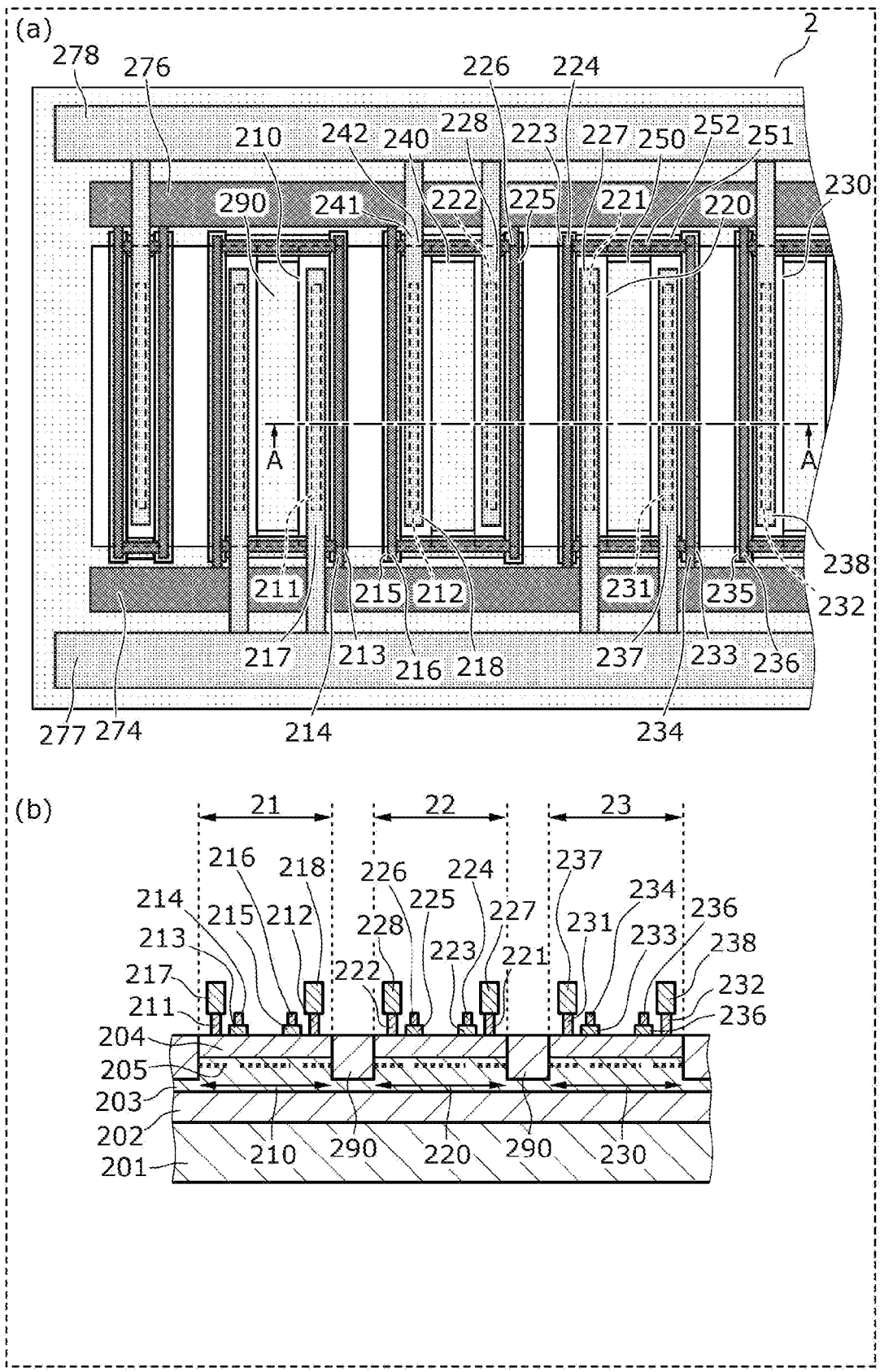
FIG. 11 illustrates an example of a semiconductor device according to Embodiment 3.
Figure 12:
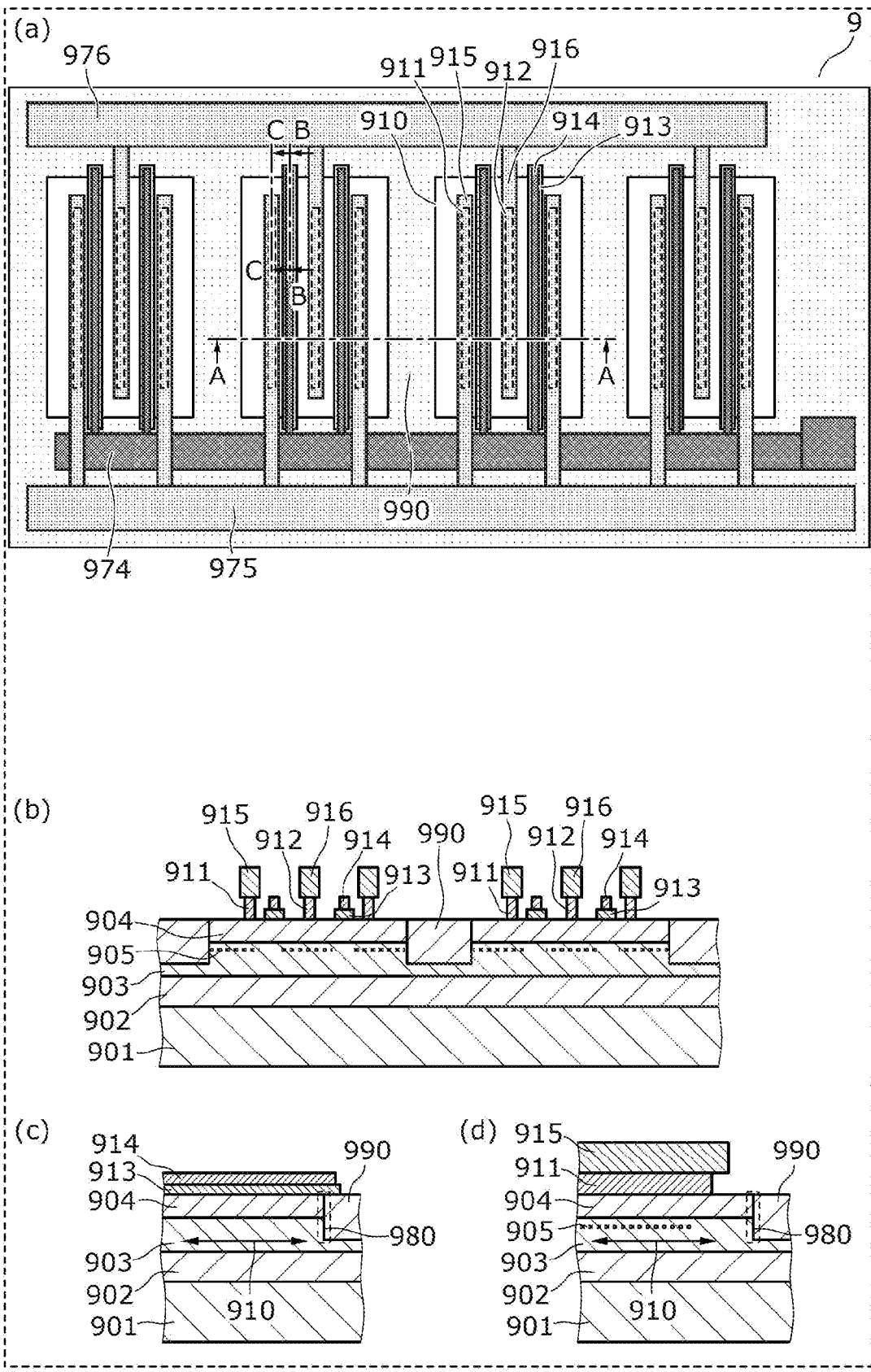
FIG. 12 illustrates an example of a conventional semiconductor device.

A semiconductor device according to Embodiment 3 is to be described. FIG. 11 illustrates an example of the semiconductor device according to Embodiment 3. Part (a) of FIG. 11 is a plan view of semiconductor device 2 according to Embodiment 3. Part (b) of FIG. 11 illustrates a cross section taken along A-A in (a) of FIG. 11. First active region 210, second active region 220, and third active region 230 are provided in semiconductor device 2.

First source electrode 211 and second source electrode 212 that are finger-shaped are provided in first active region 210, first P-type GaN layer 213 (an example of a first P-type nitride semiconductor layer) and first gate electrode 214 extend across an interface between first active region 210 and inactive region 290 and over a portion of inactive region 290, and second P-type GaN layer 215 (an example of a second P-type nitride semiconductor layer) and second gate electrode 216 extend across an interface between first active region 210 and inactive region 290 and over a portion of inactive region 290. Accordingly, first double-gate FET 21 is provided.

Third source electrode 221 and fourth source electrode 222 that are finger-shaped are provided in second active region 220, third P-type GaN layer 223 (an example of a third P-type nitride semiconductor layer) and third gate electrode 224 extend across an interface between second active region 220 and inactive region 290 and over a portion of inactive region 290, and fourth P-type GaN layer 225 (an example of a fourth P-type nitride semiconductor layer) and fourth gate electrode 226 extend across an interface between second active region 220 and inactive region 290 and over a portion of inactive region 290. Accordingly, second double-gate FET 22 is provided.

Fifth source electrode 231 and sixth source electrode 232 that are finger-shaped are provided in third active region 230, fifth P-type GaN layer 233 (an example of a fifth P-type nitride semiconductor layer) and fifth gate electrode 234 extend across an interface between third active region 230 and inactive region 290 and over a portion of inactive region 290, and sixth P-type GaN layer 235 (an example of a sixth P-type nitride semiconductor layer) and sixth gate electrode 236 extend across an interface between third active region 230 and inactive region 290 and over a portion of inactive region 290. Accordingly, third double-gate FET 23 is provided. Here, first active region 210, second active region 220, and third active region 230 are aligned and provided in the finger short-side direction, and inactive regions 290 are provided between first active region 210 and second active region 220 and between second active region 220 and third active region 230.

First source electrode 211, third source electrode 221, and fifth source line 231 are connected to first source collecting line 277 via first source line 217, third source line 227, and fifth source line 237, respectively. Second source electrode 212, fourth source electrode 222, and sixth source electrode 232 are connected to second source collecting line 278 via second source line 218, fourth source line 228, and sixth source line 238, respectively. First gate electrode 214, third gate electrode 224, and fifth gate electrode 234 are connected to first gate collecting line 274. Second gate electrode 216, fourth gate electrode 226, and sixth gate electrode 236 are connected to second gate collecting line 276. Accordingly, first double-gate FET 21, second double-gate FET 22, and third double-gate FET 23 are connected in parallel to one another.

In semiconductor device 2 according to Embodiment 3, as illustrated in (a) of FIG. 11, fourth active regions 240 are provided at two end portions in the finger lengthwise direction between first double-gate FET 21 and second double-gate FET 22, and connect first active region 210 and second active region 220. Third nitride semiconductor layer 241 that includes P-type impurities is provided above fourth active regions 240, and is connected to second P-type GaN layer 215 and fourth P-type GaN layer 225 in first active region 210, second active region 220, and fourth active regions 240. Fifth active regions 250 in each of which a two-dimensional electron gas is generated are provided at two end portions in the finger lengthwise direction between second double-gate FET 22 and third double-gate FET 23, and connect second active region 220 and third active region 230. Fourth nitride semiconductor layer 251 that includes P-type impurities is provided above fifth active regions 250, and is connected to third P-type GaN layer 223 and fifth P-type GaN layer 233 in second active region 220, third active region 230, and fifth active regions 250.

Here, operation of the FETs is to be described using second double-gate FET 22 as an example. When voltage Vgs1 of third gate electrode 224 with respect to third source electrode 221 is lower than or equal to threshold voltage Vth, second double-gate FET 22 is placed in the off state if the voltage of fourth source electrode 222 is higher than the voltage of third source electrode 221. Since fourth nitride semiconductor layer 251 is connected to third P-type GaN layer 223, 2DEG layer 205 is not generated in second active region 220 under fourth nitride semiconductor layer 251. In this manner, a leakage path from fourth source electrode 222 to third source electrode 221 via 2DEG layer 205 is prevented from being formed, a leakage current flowing from fourth source electrode 222 can be prevented if a voltage of fourth source electrode 222 is higher than the voltage of third source electrode 221. On the other hand, when voltage Vgs2 of fourth gate electrode 226 with respect to fourth source electrode 222 is lower than or equal to threshold voltage Vth, second double-gate FET 22 is placed in the off state if the voltage of third source electrode 221 is higher than the voltage of fourth source electrode 222. Since third nitride semiconductor layer 241 is connected to fourth P-type GaN layer 225, 2DEG layer 205 is not generated in second active region 220 under third nitride semiconductor layer 241. In this manner, a leakage path from third source electrode 221 to fourth source electrode 222 via 2DEG layer 205 is prevented from being formed, a leakage current flowing from third source electrode 221 can be prevented if a voltage of third source electrode 221 is higher than the voltage of fourth source electrode 222. Accordingly, semiconductor device 2 according to Embodiment 3 can reduce leakage currents in both directions.

Semiconductor device 2 according to Embodiment 3 has a configuration in which seventh gate electrode 242 is provided above third nitride semiconductor layer 241, and is connected to second gate electrode 216 and fourth gate electrode 226, yet a configuration may be adopted in which eighth gate electrode 252 is provided above fourth nitride semiconductor layer 251 and is connected to third gate electrode 224 and fifth gate electrode 234. With such a configuration, third nitride semiconductor layer 241 and fourth nitride semiconductor layer 251 have stable potentials, and leakage currents in both directions can be certainly prevented.

INDUSTRIAL APPLICABILITY

A semiconductor device according to the present disclosure can be used as a switching power supply circuit that operates at a high voltage and a high frequency.

REFERENCE SIGNS LIST 1 semiconductor device
101 substrate
102 buffer layer
103 GaN channel layer (an example of a first nitride semiconductor layer)
104 AlGaN barrier layer (an example of a second nitride semiconductor layer)
105 2DEG layer
11 first FET (first field effect transistor)
110 first active region
111 first source electrode
112 first drain electrode
113 first P-type GaN layer (an example of a first P-type nitride semiconductor layer)
114 first gate electrode
115 first source line
116 first drain line
117 recess structure
12 second FET (second field effect transistor)
120 second active region
121 second source electrode
122 second drain electrode
123 second P-type GaN layer (an example of a second P-type nitride semiconductor layer)
124 second gate electrode
125 second source line 126 second drain line
127 recess structure
130 third active region
131 third nitride semiconductor layer that includes P-type impurities
132 third gate electrode
137 recess structure
14 third FET
140 fourth active region
141 third source electrode
142 third drain electrode
143 third P-type GaN layer (an example of a third P-type nitride semiconductor layer)
144 third gate electrode
145 third source line
146 third drain line
151 third nitride semiconductor layer that includes P-type impurities
152 gate line
174 gate collecting line
175 source collecting line
176 drain collecting line
180 interface between active region and inactive region
190 inactive region
2 semiconductor device
205 2DEG layer
21 first double-gate FET
210 first active region
211 first source electrode
212 second source electrode
213 first P-type GaN layer (an example of a first P-type nitride semiconductor layer)
214 first gate electrode
215 second P-type GaN layer (an example of a second P-type nitride semiconductor layer)
216 second gate electrode
217 first source line
218 second source line
22 second double-gate FET
220 second active region
221 third source electrode
222 fourth source electrode
223 third P-type GaN layer (an example of a third P-type nitride semiconductor layer)
224 third gate electrode
225 fourth P-type GaN layer (an example of a fourth P-type nitride semiconductor layer)
226 fourth gate electrode
227 third source line
228 fourth source line
23 third double-gate FET
230 third active region
231 fifth source electrode
232 sixth source electrode
233 fifth P-type GaN layer (an example of a fifth P-type nitride semiconductor layer)
234 fifth gate electrode
235 sixth P-type GaN layer (an example of a sixth P-type nitride semiconductor layer)
236 sixth gate electrode
237 fifth source line
238 sixth source line
240 fourth active region
241 third nitride semiconductor layer that includes P-type impurities
242 seventh gate electrode
250 fifth active region
251 fourth nitride semiconductor layer that includes P-type impurities
252 eighth gate electrode
274 first gate collecting line
276 second gate collecting line
277 first source collecting line
278 second source collecting line
290 inactive region

The invention claimed is:
1. A semiconductor device comprising:
a substrate;
a first nitride semiconductor layer provided above the substrate;
a second nitride semiconductor layer provided above the first nitride semiconductor layer, and having a band gap greater than a band gap of the first nitride semiconductor layer;
a first field effect transistor; and
a second field effect transistor,
wherein in a plan view of the substrate, the first nitride semiconductor layer and the second nitride semiconductor layer include:
a first active region and a second active region in each of which a two-dimensional electron gas is generated; and
an inactive region in which no two-dimensional electron gas is generated,
the first field effect transistor is included in the first active region in the plan view of the substrate, and includes:
a first source electrode and a first drain electrode that extend in a first direction in the plan view of the substrate;
a portion of a first P-type nitride semiconductor layer provided between the first source electrode and the first drain electrode and extending in the first direction in the plan view of the substrate; and
a first gate electrode provided above the portion of the first P-type nitride semiconductor layer,
the second field effect transistor is included in the second active region in the plan view of the substrate, and includes:
a second source electrode and a second drain electrode that extend in the first direction in the plan view of the substrate;
a portion of a second P-type nitride semiconductor layer provided between the second source electrode and the second drain electrode and extending in the first direction in the plan view of the substrate; and
a second gate electrode provided above the portion of the second P-type nitride semiconductor layer,
the first nitride semiconductor layer and the second nitride semiconductor layer further include third active regions in each of which a two-dimensional electron gas is generated, the third active regions being connected to the first active region and the second active region in a second direction different from the first direction in the plan view of the substrate, at two end portions of each of the first active region and the second active region in the first direction,
the third active regions each include a portion of a third nitride semiconductor layer extending in the second direction and including P-type impurities, and
the portion of the first P-type nitride semiconductor layer and the portion of the second P-type nitride semiconductor layer are connected to each other via the por- tions of the third nitride semiconductor layer, in the first active region, the second active region, and the third active regions.

2. The semiconductor device according to claim 1, wherein third gate electrodes are provided above the portions of the third nitride semiconductor layer, and the first gate electrode and the second gate electrode are connected to each other via the third gate electrodes.

3. The semiconductor device according to claim 1, wherein the portions of the third nitride semiconductor layer each extend over a portion of the inactive region.

4. The semiconductor device according to claim 1, wherein in the plan view of the substrate, a first inactive region is provided between the first active region and the second active region, the first inactive region being a portion of the inactive region, and
in the plan view of the substrate, the first inactive region is surrounded by the first active region, the second active region, and the third active regions.

5. The semiconductor device according to claim 1, wherein a length of the portion of the first P-type nitride semiconductor layer in a direction in which the portion of the first P-type nitride semiconductor layer extends is longer than a length of the portions of the third nitride semiconductor layer in the second direction.

6. The semiconductor device according to claim 1, wherein when the first gate electrode has a potential difference of 0 V with respect to the first source electrode and the second gate electrode has a potential difference of 0 V with respect to the second source electrode,
no two-dimensional electron gas is generated in the first active region under the portion of the first P-type nitride semiconductor layer,
no two-dimensional electron gas is generated in the second active region under the portion of the second P-type nitride semiconductor layer, and
no two-dimensional electron gas is generated in the third active regions under the portions of the third nitride semiconductor layer.

7. The semiconductor device according to claim 6, wherein a recess is provided in the second nitride semiconductor layer under the portion of the first P-type nitride semiconductor layer,
a recess is provided in the second nitride semiconductor layer under the portion of the second P-type nitride semiconductor layer, and
a recess is provided in the second nitride semiconductor layer under each of the portions of the third nitride semiconductor layer.

8. The semiconductor device according to claim 7, wherein the recess provided under each of the portions of the third nitride semiconductor layer extends into a portion of the inactive region.

9. The semiconductor device according to claim 1, wherein when n is an integer of at least 2,
n+1 first source electrodes are provided, the n+1 first source electrodes each being the first source electrode,
n first drain electrodes are provided, the n first drain electrodes each being the first drain electrode,
the first P-type nitride semiconductor layer includes 2×n portions, the 2×n portions each being the portion of the first P-type nitride semiconductor layer, and
2×n first gate electrodes are provided, the 2×n first gate electrodes each being the first gate electrode,
n+1 second source electrodes are provided, the n+1 second source electrodes each being the second source electrode,
n second drain electrodes are provided, the n second drain electrodes each being the second drain electrode,
the second P-type nitride semiconductor layer includes 2×n portions, the 2×n portions each being the portion of the second P-type nitride semiconductor layer, and
2×n second gate electrodes are provided, the 2×n second gate electrodes each being the second gate electrode.

10. The semiconductor device according to claim 9, wherein out of the n+1 first source electrodes, a first source electrode between two of the n first drain electrodes is surrounded by at least two of the 2×n portions of the first P-type nitride semiconductor layer in the first active region, and
out of the n+1 second source electrodes, a second source electrode between two of the n second drain electrodes is surrounded by at least two of the 2×n portions of the second P-type nitride semiconductor layer in the second active region.

11. The semiconductor device according to claim 1, wherein the first nitride semiconductor layer and the second nitride semiconductor layer further include fourth active regions in each of which a two-dimensional electron gas is generated, the fourth active regions being provided on two ends of an extension in the second direction and spaced apart from the first active region and the second active region in the plan view of the substrate,
in each of the fourth active regions,
a third source electrode and a third drain electrode extend in the first direction in the plan view of the substrate,
a portion of a third P-type nitride semiconductor layer is provided between the third source electrode and the third drain electrode and extends in the first direction in the plan view of the substrate, and
a fourth gate electrode is provided above the portion of the third P-type nitride semiconductor layer, and
in each of the fourth active regions, the third P-type nitride semiconductor layer located in an end portion in the second direction surrounds the third source electrode located in the end portion in the second direction.

12. The semiconductor device according to claim 11, wherein the third source electrode has a width equal to a width of the first source electrode.

13. The semiconductor device according to claim 2, wherein in the plan view of the substrate, a gate line is provided between the first field effect transistor and the second field effect transistor, and
the gate line is electrically connected to the third gate electrode.

14. The semiconductor device according to claim 13, wherein in the plan view of the substrate, a second inactive region is provided between the first active region and the second active region, the second inactive region being a portion of the inactive region,
in the plan view of the substrate, the second inactive region is surrounded by the first active region, the second active region, and the third active regions, and
the gate line is provided over the second inactive region.

15. The semiconductor device according to claim 13,
wherein a length of the gate line in a short-side direction is longer than a length of the first gate electrode in the short-side direction.

16. The semiconductor device according to claim 13, further comprising:
a first source line provided above and electrically connected to the first source electrode,
wherein an electrode material of the gate line is same as an electrode material of the first source line.

17. The semiconductor device according to claim 1,
wherein a plurality of unit cells are spaced apart from one another in the first direction, the plurality of unit cells each including the first field effect transistor provided in the first active region, the second field effect transistor provided in the second active region, and the portions of the third nitride semiconductor layer provided in the third active regions,
a plurality of first source electrodes spaced apart from one another are connected by a single first source line, the plurality of first source electrodes each being the first source electrode,
a plurality of first drain electrodes spaced apart from one another are connected by a single first drain line, the plurality of first drain electrodes each being the first drain electrode,
a plurality of portions of the first P-type nitride semiconductor layer are connected to one another in the first direction, the plurality of portions of the first P-type nitride semiconductor layer each being the portion of the first P-type nitride semiconductor layer,
a plurality of first gate electrodes are connected to one another in the first direction, the plurality of first gate electrodes each being the first gate electrode,
a plurality of second source electrodes spaced apart from one another are connected by a single second source line, the plurality of second source electrodes each being the second source electrode,
a plurality of second drain electrodes spaced apart from one another are connected by a single second drain line, the plurality of second drain electrodes each being the second drain electrode,
a plurality of portions of the second P-type nitride semiconductor layer are connected to one another in the first direction, the plurality of portions of the second P-type nitride semiconductor layer each being the portion of the second P-type nitride semiconductor layer, and
a plurality of second gate electrodes are connected to one another in the first direction, the plurality of second gate electrodes each being the second gate electrode.

18. The semiconductor device according to claim 17,
wherein a third inactive region is provided between two of the first active regions provided in the first direction, the third inactive region being a portion of the inactive region, and
a fourth inactive region is provided between two of the second active regions provided in the first direction, the fourth inactive region being a portion of the inactive region.

19. A semiconductor device comprising:
a substrate;
a first nitride semiconductor layer provided above the substrate;
a second nitride semiconductor layer provided above the first nitride semiconductor layer, and having a band gap greater than a band gap of the first nitride semiconductor layer;
a first double-gate field effect transistor;
a second double-gate field effect transistor; and
a third double-gate field effect transistor,
wherein in a plan view of the substrate, the first nitride semiconductor layer and the second nitride semiconductor layer include:
a first active region, a second active region, and a third active region in each of which a two-dimensional electron gas is generated; and
an inactive region in which no two-dimensional electron gas is generated, the first double-gate field effect transistor is included in the first active region, and includes:
a first source electrode and a second source electrode that extend in a first direction in the plan view of the substrate;
a portion of a first P-type nitride semiconductor layer and a portion of a second P-type nitride semiconductor layer separately provided between the first source electrode and the second source electrode and extending in the first direction in the plan view of the substrate;
a first gate electrode provided above the portion of the first P-type nitride semiconductor layer; and
a second gate electrode provided above the portion of the second P-type nitride semiconductor layer,
the second double-gate field effect transistor is included in the second active region, and includes:
a third source electrode and a fourth source electrode that extend in the first direction in the plan view of the substrate;
a portion of a third P-type nitride semiconductor layer and a portion of a fourth P-type nitride semiconductor layer separately provided between the third source electrode and the fourth source electrode and extending in the first direction in the plan view of the substrate;
a third gate electrode provided above the portion of the third P-type nitride semiconductor layer; and
a fourth gate electrode provided above the portion of the fourth P-type nitride semiconductor layer,
the third double-gate field effect transistor is included in the third active region, and includes:
a fifth source electrode and a sixth source electrode that extend in the first direction in the plan view of the substrate;
a portion of a fifth P-type nitride semiconductor layer and a portion of a sixth P-type nitride semiconductor layer separately provided between the fifth source electrode and the sixth source electrode and extending in the first direction in the plan view of the substrate;
a fifth gate electrode provided above the portion of the fourth P-type nitride semiconductor layer; and
a sixth gate electrode provided above the portion of the sixth P-type nitride semiconductor layer,
the first nitride semiconductor layer and the second nitride semiconductor layer further include fourth active regions at two end portions of each of the first active region and the second active region in the first direction in the plan view of the substrate, the fourth active regions being regions in each of which a two-dimensional electron gas is generated, being connected to the first active region and the second active region, and each being in a quadrilateral shape that extends in a second direction different from the first direction, the fourth active regions each include a portion of a third nitride semiconductor layer extending in the second direction in the plan view of the substrate and including P-type impurities, the portion of the second P-type nitride semiconductor layer and the portion of the fourth P-type nitride semiconductor layer are connected to each other via the portions of the third nitride semiconductor layer, in the first active region, the second active region, and the fourth active regions, the first nitride semiconductor layer and the second nitride semiconductor layer further include fifth active regions at two end portions of each of the second active region and the third active region in the first direction in the plan view of the substrate, the fifth active regions being regions in each of which a two-dimensional electron gas is generated, being connected to the second active region and the third active region, and extending in the second direction, the fifth active regions each include a portion of a fourth nitride semiconductor layer extending in the second direction in the plan view of the substrate, and including P-type impurities, and the portion of the third P-type nitride semiconductor layer and the portion of the fifth P-type nitride semiconductor layer are connected to each other via the portions of the fourth nitride semiconductor layer, in the second active region, the third active region, and the fifth active regions.

* * * * *